(12) United States Patent
Abdo (10) Patent No.: US 11,164,101 B2
(45) Date of Patent: *Nov. 2, 2021

(54) DISPERSIVE-RESISTIVE HYBRID ATTENUATOR FOR QUANTUM MICROWAVE CIRCUITS

(71) Applicant: International Business Machines Corporation, Armonk, NY (US)

(72) Inventor: Baleegh Abdo, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/738,562

(22) Filed: Jan. 9, 2020

(65) Prior Publication Data

US 2020/0151602 A1 May 14, 2020

Related U.S. Application Data

(62) Division of application No. 16/114,793, filed on Aug. 28, 2018.

(51) Int. Cl.
| | |
|---|---|
| *H01P 1/22* | (2006.01) |
| *G06N 10/00* | (2019.01) |
| *H01P 5/18* | (2006.01) |
| *H01L 39/02* | (2006.01) |
| *H01L 39/22* | (2006.01) |
| *H03H 11/24* | (2006.01) |

(52) U.S. Cl.
CPC ........... *G06N 10/00* (2019.01); *H01L 39/025* (2013.01); *H01L 39/223* (2013.01); *H01P 1/22* (2013.01); *H01P 5/184* (2013.01); *H03H 11/24* (2013.01)

(58) Field of Classification Search
CPC .......... H01P 1/22; H01P 1/227; H03H 11/24; H03H 7/24
USPC ....................................... 333/167, 168, 81 R
See application file for complete search history.

(56) References Cited

U.S. PATENT DOCUMENTS

| | | | | |
|---|---|---|---|---|
| 7,203,474 | B2 * | 4/2007 | Shimada | H04B 1/12 333/167 |
| 7,852,171 | B2 * | 12/2010 | Das | H01P 1/227 333/81 A |
| 8,179,209 | B2 * | 5/2012 | Hirama | H03H 9/56 333/167 |
| 10,886,586 | B2 * | 1/2021 | Abdo | H01P 1/22 |
| 2009/0231068 | A1 | 9/2009 | Das et al. | |

(Continued)

OTHER PUBLICATIONS

List of all IBM related dockets, Appendix P, 2019.

(Continued)

*Primary Examiner* — Stephen E. Jones
(74) *Attorney, Agent, or Firm* — Garg Law Firm, PLLC; Rakesh Garg; Douglas Pearson (57) ABSTRACT

A resistive component in a hybrid microwave attenuator circuit is configured to attenuate a plurality of frequencies in an input signal. The hybrid microwave attenuator circuit is further configured with a dispersive component to attenuate a second plurality of frequencies within a frequency range by reflecting off portions of the input signal at those frequencies that are within the frequency range. The resistive component and the dispersive component are arranged in a series configuration relative to one another in the hybrid microwave attenuator circuit.

12 Claims, 8 Drawing Sheets

(56) References Cited

U.S. PATENT DOCUMENTS

| | | | |
|---|---|---|---|
| 2010/0207706 A1* | 8/2010 | Tamura | H03H 7/1791 333/168 |
| 2012/0256703 A1* | 10/2012 | Hong | H01P 1/20336 333/168 |

OTHER PUBLICATIONS

OA1, Application No. 201980056229.8, Jun. 28, 2021.
OA1 Translation, Application No. 201980056229.8, Jun. 28, 2021.
OA1, Application No. 201980056949.4, Jul. 9, 2021.
OA1 Translation, Application No. 201980056949.4, Jul. 9, 2021.
Yeh et al., Microwave attenuators for use with quantum devices below 100 mK, Journal of Applied Physics 121, 2017.

\* cited by examiner

FIGURE 2 (PRIOR-ART)

DISPERSIVE-RESISTIVE HYBRID ATTENUATOR FOR QUANTUM MICROWAVE CIRCUITS

TECHNICAL FIELD

The present invention relates generally to a device, a circuit design method, and a circuit construction system for a microwave frequency attenuator usable with superconducting qubits in quantum computing. More particularly, the present invention relates to a device, method, and system for dispersive-resistive hybrid attenuator for quantum microwave circuits.

BACKGROUND

Hereinafter, a "Q" prefix in a word of phrase is indicative of a reference of that word or phrase in a quantum computing context unless expressly distinguished where used.

Molecules and subatomic particles follow the laws of quantum mechanics, a branch of physics that explores how the physical world works at the most fundamental levels. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of entangled qubit devices (compactly referred to herein as "qubit," plural "qubits") to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These 1s and 0s act as on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor using superconducting qubits (IBM is a registered trademark of International Business Machines corporation in the United States and in other countries.)

A superconducting qubit includes a Josephson junction. A Josephson junction is formed by separating two thin-film superconducting metal layers by a non-superconducting material. When the metal in the superconducting layers is caused to become superconducting—e.g. by reducing the temperature of the metal to a specified cryogenic temperature-pairs of electrons can tunnel from one superconducting layer through the non-superconducting layer to the other superconducting layer. In a qubit, the Josephson junction—which functions as a dispersive nonlinear inductor—is electrically coupled in parallel with one or more capacitive devices forming a nonlinear microwave oscillator. The oscillator has a resonance/transition frequency determined by the value of the inductance and the capacitance in the qubit circuit. Any reference to the term "qubit" is a reference to a superconducting qubit circuitry that employs a Josephson junction, unless expressly distinguished where used.

The information processed by qubits is carried or transmitted in the form of microwave signals/photons in the range of microwave frequencies. The microwave signals are captured, processed, and analyzed to decipher the quantum information encoded therein. A readout circuit is a circuit coupled with the qubit to capture, read, and measure the quantum state of the qubit. An output of the readout circuit is information usable by a q-processor to perform computations.

A superconducting qubit has two quantum states—|0> and |1>. These two states may be two energy states of atoms, for example, the ground (|g>) and first excited state (|e>) of a superconducting artificial atom (superconducting qubit). Other examples include spin-up and spin-down of the nuclear or electronic spins, two positions of a crystalline defect, and two states of a quantum dot. Since the system is of a quantum nature, any combination of the two states are allowed and valid.

For quantum computing using qubits to be reliable, quantum circuits (q-circuits), e.g., the qubits themselves, the readout circuitry associated with the qubits, and other parts of the quantum processor, must not alter the energy states of the qubit, such as by injecting or dissipating energy in any significant manner, or influence the relative phase between the |0> and |1> states of the qubit. This operational constraint on any circuit that operates with quantum information necessitates special considerations in fabricating semiconductor and superconducting structures that are used in such circuits.

The presently available superconducting quantum circuits are formed using materials that become superconducting at cryogenically low temperatures, e.g., at about 10-100 millikelvin (mK), or about 4 K. The electronic circuits that are used to control, operate, and measure the quantum circuits are usually located outside the dilution fridge that houses the superconducting quantum circuit. The temperature outside the fridge is usually about 300 K (room temperature).

The presently available superconducting quantum circuits usually operate in the microwave frequency range. Microwave signals/pulses are used to initialize, manipulate, control, and measure the superconducting qubits within the superconducting q-circuits. To communicate these microwave signals between the external electronic circuits outside the fridge and the superconducting quantum circuits inside the fridge, microwave transmission lines are used inside the dilution fridge. Coaxial lines are one example of transmission lines that can carry these microwave signals.

The presently available dilution fridges are cryogenic apparatus which can be used to cool down samples/devices to millikelvin temperatures. However, the transition from room temperature to millikelvin temperatures inside the fridge is not sudden or abrupt. To facilitate the temperature transition and the cooling operation, the dilution fridge consists of multiple thermally-isolated stages (compactly referred to herein as "stage", plural "stages") held at different ambient temperatures. For example, common commercial dilution fridges have 5 temperature-stages inside the fridge 40 K, 4 K, 0.7 K, 0.1 K, 0.01 K (also known as the base stage). To simplify the discussion, we focus below on the input lines inside the fridge. To maintain the temperature difference between the different stages inside the fridge and to protect the quantum circuits from noise coming down the input lines, which originates from room-temperature electronics or blackbody radiation of higher stages or other sources of electromagnetic noise, it is common practice to use lossy transmission lines to connect between two consecutive stages and to incorporate resistive attenuators and filters in the path of these lines at the different stages. In general, components serve multiple purposes: they attenuate/reduce the noise coming down these input lines, they attenuate/reduce microwave signals propagating in the lines, they provide thermal isolation between the stages, they cool down the microwave signals propagating through them.

A signal propagating on a line passing through a stage can contain noise, especially electromagnetic noise. This noise can be in the microwave frequency spectrum or infrared spectrum. For the reasons described herein, electronic, microwave and infrared noise are undesirable when the lines and signals relate to quantum computing using q-circuits.

Attenuation of a signal is the process of reducing the power of the signal at a particular frequency or frequency-range. An attenuator is an electronic circuit with two ports that is configured to attenuate an input signal/noise at a particular frequency or frequency-range.

A resistive attenuator attenuates a transmitted signal and/or noise by dissipating the energy of the signal and/or noise in a resistive component of the attenuator. A dispersive attenuator attenuates the transmitted signal/noise through its two ports by reflecting a portion of its energy/power off the port it entered through.

The illustrative embodiments recognize that commercially available standard microwave attenuators are either resistive or dispersive but not both. Furthermore, the illustrative embodiments recognize certain disadvantages with the presently available resistive microwave attenuators. For example, in most cases, the presently available resistive attenuators are formed such that a metallic case enclosing the substrate is stainless steel, which has poor thermal conductance. Additionally, the pins of the connectors located on either port of the resistive attenuator are mechanically pressed against the conductor on the substrate, which yields a bad thermal contact. The substrate is mechanically pushed against the body of the metallic case, which also yields a bad thermal contact. In addition, the substrate materials used for these attenuators have far from ideal thermal conductance.

The illustrative embodiments further recognize that disadvantageously, the lower the attenuation in a presently available resistive attenuator, the higher the thermal and electrical resistance between the center conductor of the attenuator and a corresponding external conductor of the attenuator (e.g., ground), formed by the metallic case of the attenuator. The illustrative embodiments recognize that presently, the presently available resistive attenuator provide a fixed attenuation across a wide band of frequencies and its attenuation level cannot be made to be frequency dependent (i.e., the attenuation level is fixed versus frequency). Furthermore, the presently available resistive attenuators dissipate the microwave power in the attenuator itself. Such absorptive attenuation can have several undesired results: (1) it could raise the temperature of the attenuator, especially if the attenuator is poorly thermalized to the stage, leading to reduced cooling of the microwave signals passing through it. (2) it could raise the temperature of the stage especially if it has many attenuators and limited cooling power. (3) it could generate elevated blackbody radiation towards the lower-temperature stages.

The illustrative embodiments recognize certain disadvantages with the presently available dispersive type of commercial microwave attenuators as well. They suffer from similar thermalization issues as resistive attenuators outlined above. In addition, they can cause multiple reflections of signals in the line, which, in turn, can cause distortions in the microwave pulses/signals, crosstalk, and ripples in the measured signals.

SUMMARY

The illustrative embodiments provide an electronic attenuating device, a circuit design method, and system for constructing a hybrid microwave attenuator circuit. An embodiment constructs the attenuator circuit to include a resistive component configured to attenuate a plurality of frequencies in an input signal. The embodiment further includes in the attenuator circuit a dispersive component configured to attenuate a second plurality of frequencies within a frequency range by reflecting off portions of the input signal at those frequencies that are within the frequency range, wherein the resistive component and the dispersive component are arranged in a series configuration relative to one another.

In one embodiment, the attenuator circuit further includes a lowpass filter and a high-pass filter.

In another embodiment, the lowpass filter provides a greater than a threshold attenuation for frequencies that are in and above a qubit frequency range in the input signal, and the high-pass filter provides greater than the threshold attenuation for frequencies in and below the qubit frequency range in the input signal.

In another embodiment, the lowpass filter comprises a configuration of an inductive and a capacitive element such that the capacitive element is coupled to an external conductor, which is part of the attenuator case or housing.

In another embodiment, the high-pass filter comprises a configuration of an inductive and a capacitive element such that the inductive element is coupled to an external conductor, which is part of the attenuator case or housing.

In another embodiment, the dispersive component further includes a bandpass filter.

In another embodiment, the bandpass filter provides a greater than a threshold attenuation for frequencies in a qubit readout frequency range in the input signal.

In another embodiment, the bandpass filter comprises a configuration of inductive and capacitive elements such that at least one of the capacitive elements is coupled to an internal conductor and operates as a direct current block, and wherein at least one of the inductive elements is coupled to an external conductor, which is part of the attenuator case or housing.

In another embodiment, the resistive component comprises a set of resistive elements configured in a T-arrangement.

In another embodiment, the resistive component comprises a set of resistive elements configured in a pi-arrangement.

In another embodiment, the resistive component provides a greater than a threshold attenuation for all frequencies of the input signal.

An embodiment includes a method for building the attenuating circuit.

An embodiment includes a system for constructing or assembling the attenuating circuit.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

The illustrative embodiments used to describe the invention generally address and solve the above-described needs for attenuating certain microwave signals mainly in the input lines connecting to q-circuits. The illustrative embodiments provide dispersive-resistive hybrid attenuator for quantum microwave circuits, which address the above-described need or problem.

An operation described herein as occurring with respect to a frequency of frequencies should be interpreted as occurring with respect to a signal of that frequency or frequencies. All references to a "signal" are references to a microwave signal unless expressly distinguished where used.

An embodiment provides a configuration of a hybrid microwave attenuator that exhibits both resistive characteristics as well as dispersive characteristics (interchangeably referred to herein as a "hybrid attenuator"). Another embodiment provides a design/construction method for the hybrid attenuator, such that the method can be implemented as a software application. The application implementing a design/construction method embodiment can be configured to operate in conjunction with an existing circuit manufacturing system—such as a circuit assembly system.

For the clarity of the description, and without implying any limitation thereto, the illustrative embodiments are described using some example configurations. From this disclosure, those of ordinary skill in the art will be able to conceive many alterations, adaptations, and modifications of a described configuration for achieving a described purpose, and the same are contemplated within the scope of the illustrative embodiments.

Furthermore, simplified diagrams of the example resistors, inductors, capacitors, and other circuit components are used in the figures and the illustrative embodiments. In an actual circuit, additional structures or component that are not shown or described herein, or structures or components different from those shown but for a similar function as described herein may be present without departing the scope of the illustrative embodiments.

Furthermore, the illustrative embodiments are described with respect to specific actual or hypothetical components only as examples. The steps described by the various illustrative embodiments can be adapted for fabricating a circuit using a variety of components that can be purposed or repurposed to provide a described function within a hybrid attenuator, and such adaptations are contemplated within the scope of the illustrative embodiments.

The illustrative embodiments are described with respect to certain types of materials, electrical properties, steps, numerosity, frequencies, circuits, components, and applications only as examples. Any specific manifestations of these and other similar artifacts are not intended to be limiting to the invention. Any suitable manifestation of these and other similar artifacts can be selected within the scope of the illustrative embodiments.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 1:
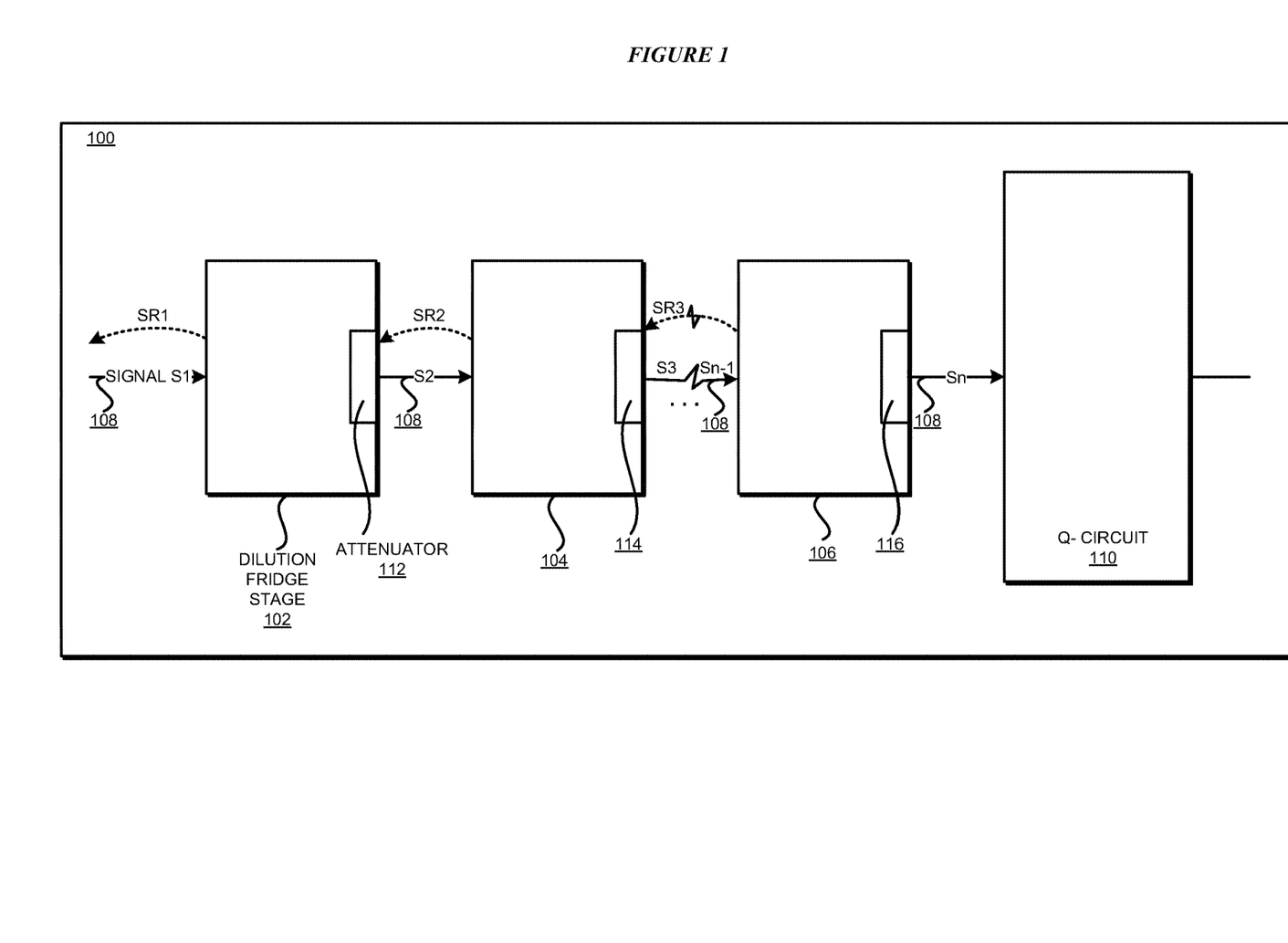
FIG. 1 depicts a block diagram of an example configuration of an input line conditioning for quantum computing devices in accordance with an illustrative embodiment.

With reference to FIG. 1, this figure depicts a block diagram of an example configuration of an input line conditioning for quantum computing devices in accordance with an illustrative embodiment. Configuration 100 comprises a set of one or more dilution fridge stages 102, 104, . . . 106. Input line 108 connects an external circuit to q-circuit 110. Assuming that line 108 carries a microwave signal to q-circuit 110, signal $S_1$ is a signal which includes microwave noise that is to be attenuated along with the signal $S_1$. Signal $S_1$, is the attenuated signal that reaches q-circuit 110.

One embodiment configures a hybrid attenuator with some but not all of stages 102-106. Another embodiment configures a hybrid attenuator with each of stages 102-106, as shown in FIG. 1. For example, hybrid attenuator 112 is configured to operate with stage 102. Hybrid attenuator 112 receives input signal $S_1$ and reflected signal $S_{R2}$ from subsequent stages in the series of stages. Hybrid attenuator 112 attenuates one frequency or frequency band from the ($S_1$+$S_{R2}$) signal to produce signal $S_2$.

Hybrid attenuator 114 is configured to operate with stage 104. Hybrid attenuator 114 receives input signal $S_2$ and reflected signal $S_{R3}$ from subsequent stages in the series of stages. Hybrid attenuator 114 attenuates a different frequency or frequency band from the ($S_2$+$S_{R3}$) signal to produce signal $S_3$. Operating in this manner, stage 116 (stage n) has hybrid attenuator 116 configured therewith. Hybrid attenuator 116 receives input signal $S_{n-1}$ (and possibly a reflected signal if q-circuit 110 is configured to reflect any signal frequencies, not shown) from previous stages in the series of stages. Hybrid attenuator 116 attenuates a different frequency or frequency band from the ($S_{n-1}$+ any reflected frequencies) signal to produce signal $S_n$, which forms an input to q-circuit 110.

Figure 2:
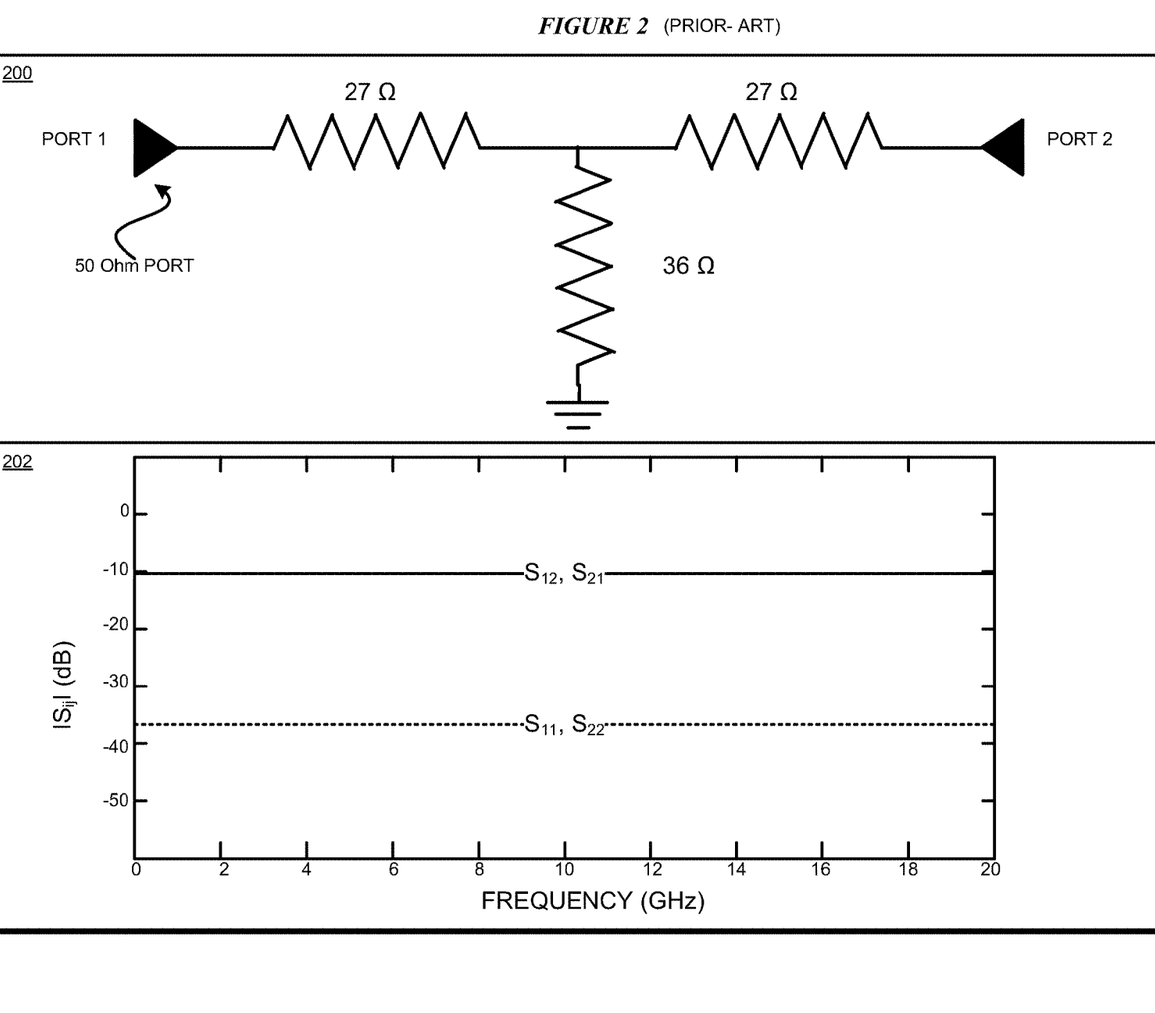
FIG. 2 depicts an example of presently available resistive microwave attenuator which can be used as a component in a hybrid attenuator in accordance with an illustrative embodiment.

With reference to FIG. 2, this figure depicts an example of presently available resistive microwave attenuator which can be used as a component in a hybrid attenuator in accordance with an illustrative embodiment. Circuit 200 implements an example 10-dB lumped-element resistive attenuator that is formed using a T-configuration between ports 1 and 2, (i.e., two equal series resistors connected in the middle by one resistor to ground). In microwave engineering terminology, Sit represents the scattering parameter for a signal entering port 2 and exiting through port 1 (i.e., transmission from port 1 to 2). Similarly, $S_{21}$ represents the scattering parameter for a signal entering port 1 and exiting through port 2. $S_{11}$ and $S_{22}$ represent the reflection parameters of signals entering ports 1 and 2, respectively.

Graph 202 depicts microwave simulation results of the scattering parameters of resistive attenuator 200. As can be seen in graph 202, transmitted signals through the device (represented by the amplitude of the scattering parameters $S_{21}$ and $S_{12}$) are attenuated by 10 dB over a large bandwidth. The device is also well matched to 50 Ohms on both ports as shown by the negligible amplitude of the reflection parameters $S_{11}$ and $S_{22}$. This means that there is almost no reflection off the device ports. The lost energy of the transmitted signals is dissipated as heat within the resistors of the circuit 200.

Figure 3:
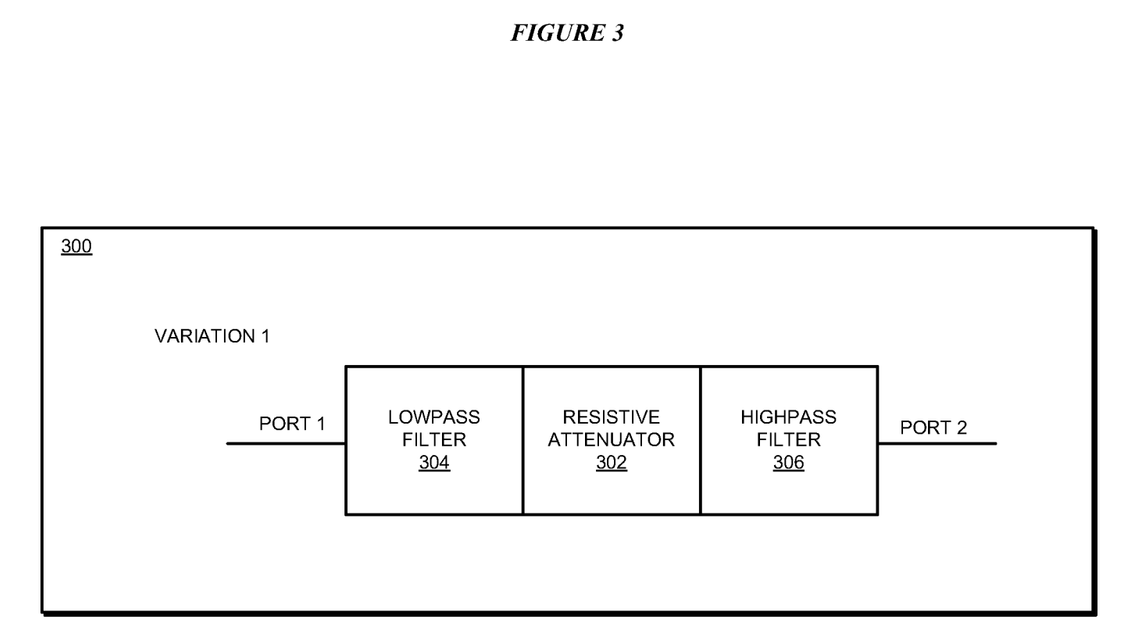
FIG. 3 depicts one example configuration of a hybrid attenuator in accordance with an illustrative embodiment.

With reference to FIG. 3, this figure depicts one example configuration of a hybrid attenuator in accordance with an illustrative embodiment. The example configuration in this figure—variation 1—of hybrid attenuator 300 comprises resistive attenuator 302, lowpass filter 304, and high-pass filter 306. The components can be arranged in a variety of arrangements within the scope of the illustrative embodiments. For example, one arrangement may be 304-302-306 in that order as shown (i.e., lowpass filter 304, followed by resistive attenuator 302, followed by high-pass filter 306). Other arrangements may be 302-304-306, 304-306-302, 306-302-304, 306-304-302, and others possible arrangements in a similar manner.

Hybrid attenuator 300 is a dispersive-resistive attenuator and can be implemented as a two-port integrated circuit. Lowpass filter 304 is a dispersive filter to filter out a frequency band that is higher than a threshold frequency (and passes a frequency band that is lower than a threshold frequency). Resistive attenuator 302 is resistive or absorptive filter that operates in the manner of resistive attenuator 200 in FIG. 2. High-pass filter 306 is a dispersive filter to filter out a frequency band that is lower than a threshold frequency (and passes a frequency band that is higher than a threshold frequency). According to one embodiment, a circuit assembly system forms and connects the three components—302, 304, and 306 on the same chip or printed circuit board.

Figure 4:
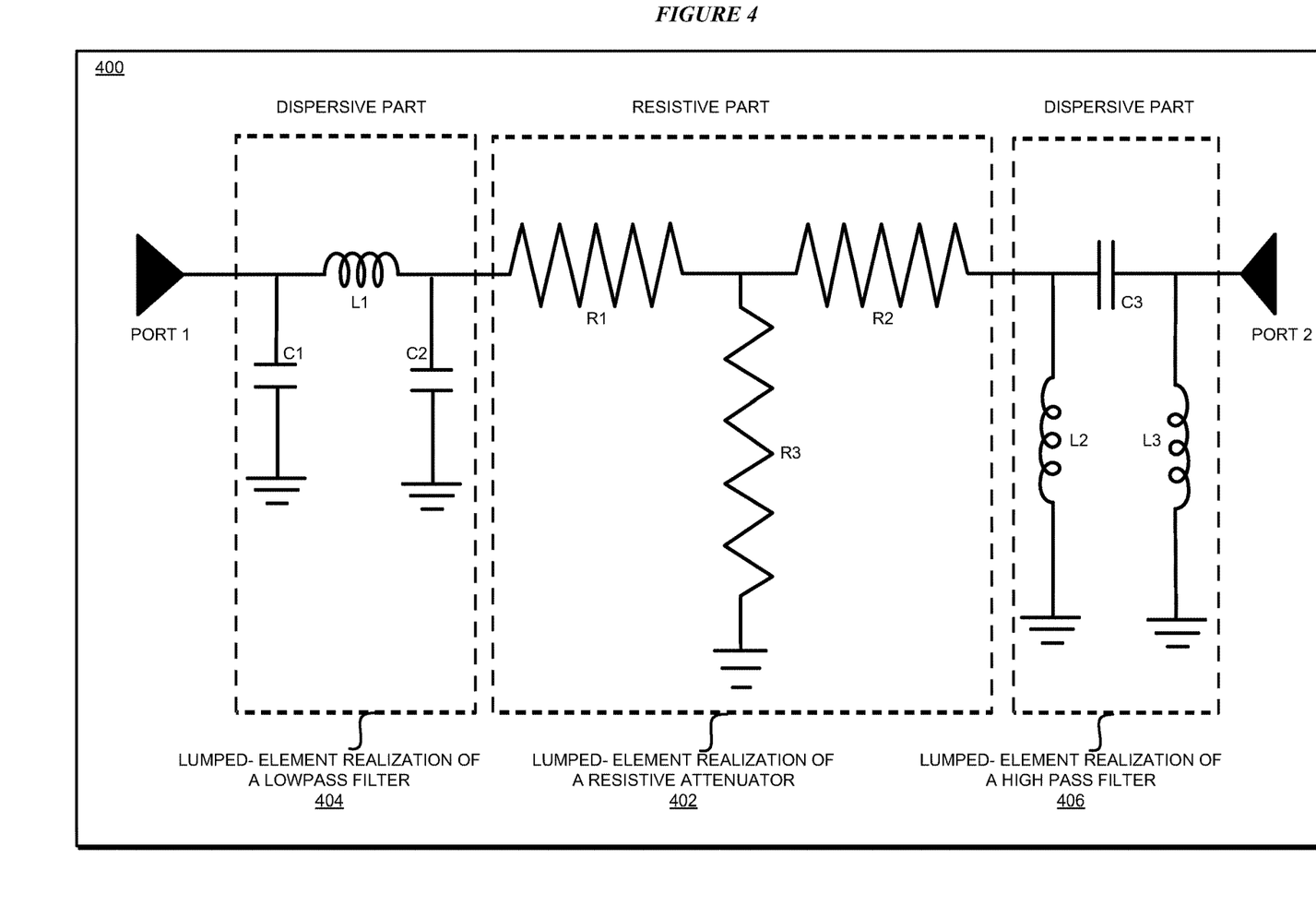
FIG. 4 depicts an example circuit implementing a hybrid attenuator in accordance with an illustrative embodiment.

With reference to FIG. 4, this figure depicts an example circuit implementing a hybrid attenuator in accordance with an illustrative embodiment. Component 402 is a resistive element which implements a resistive attenuator, i.e., component 302 of FIG. 3. Component 404 is a dispersive element which implements a lowpass filter, i.e., component 304 of FIG. 3. Component 406 is a dispersive element which implements a high-pass filter, i.e., component 306 of FIG. 3.

Component 402 comprises a T-configuration of resistor elements R1, R2, and R3, as in FIG. 2. Note that the depiction of component 402 and resistors R1, R2, and R3 are lumped realizations, i.e., a representation of an effective function of component 402 as a resistive attenuator in the microwave frequency band. An equivalent pi-configuration of this component exists and is interchangeable with the depicted non-limiting example configuration.

Component 404 comprises a pi-arrangement of capacitive elements C1 and C2 coupled to ground, i.e., the external conductor of the hybrid attenuator, on one side and to inductive element L1 via the center conductor of the hybrid attenuator on the other side, as shown. The depiction of component 404 and elements C1, C2, and L1 are lumped realizations, i.e., a representation of an effective function of component 404 as a lowpass filter in the microwave frequency band. This example shows a simple one-unit-cell, low-pass filter. This design also covers the cases in which the simple low-pass filter shown in FIG. 4 is replaced by a more sophisticated low-pass filter that consists of several unit cells and whose attenuation, transmission, bandwidth, cutoff frequency and ripples characteristics are optimized further or differently.

Component 406 comprises a pi-arrangement of inductive elements L2 and L3 coupled to ground, i.e., the external conductor of the hybrid attenuator, on one side and to capacitive element C3 via the center conductor of the hybrid attenuator on the other side, as shown. The depiction of component 406 and elements L2, L3, and C3 are lumped realizations, i.e., a representation of an effective function of component 406 as a high-pass filter in the microwave frequency band. This example shows a simple one-unit-cell, high-pass filter. This design also covers the cases in which the simple high-pass filter shown in FIG. 4 is replaced by a more sophisticated high-pass filter that consists of several unit cells and whose attenuation, transmission, bandwidth, cutoff frequency and ripples characteristics are optimized further or differently.

In component 406, capacitive element C3 on the center conductor of the hybrid attenuator serves as a direct current (DC) block which can be used to eliminate the formation of ground loops in the fridge. Such ground loops are undesirable as they can generate electronic noise. Additionally, inductive elements L2 and L3 offer a path of negligible resistance between the center conductor and the external conductor of the hybrid attenuator. Such low-resistance, electrical-thermal paths can significantly improve the thermalization of the center conductor of the hybrid attenuator compared to the case of the resistive attenuator alone, where the center conductor is thermally isolated from ground (the attenuator case) by a considerable electrical-thermal resistance.

The lumped realizations of components 402, 404, and 406 are not intended to be limiting. From this disclosure, those of ordinary skill in the art will be able to conceive many other implementations for a depicted lumped realization, e.g., using additional or different elements to achieve a similar function of the lumped realization shown here, and such implementations are contemplated within the scope of the illustrative embodiments.

Figure 5:
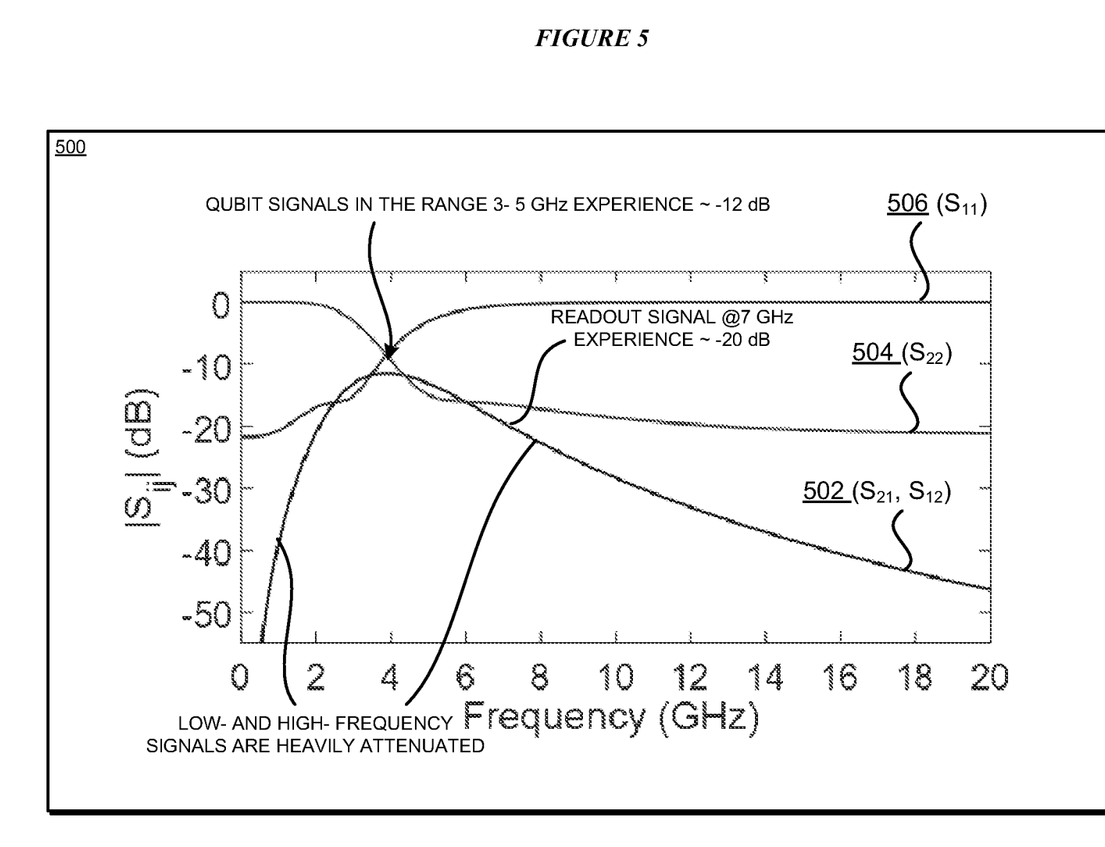
FIG. 5 depicts microwave simulation results of the scattering parameters of a hybrid attenuator example.

With reference to FIG. 5, this figure depicts microwave simulation results of the scattering parameters of a hybrid attenuator example. The hybrid attenuator circuit, whose scattering parameters are shown in FIG. 5, is based on the lumped-element circuit 400 exhibited in FIG. 4. Specifically, in the non-limiting example implementation, R1 and R2 were each set to 27 Ohms, R3 was set to 36 Ohms, L1 was set to 3.18 nanohenry (nH), C1 and C2 were each set to 0.64 picofarad (pF), L2 and L3 were each set to 2.65 nH, and C3 was set to 0.53 pF.

In FIG. 5, the graph 502 represents the transmission parameters $S_{21}$ and $S_{12}$, while the graphs 506 and 504 represent the reflection parameter $S_{11}$ and $S_{22}$, respectively. Graph 502 shows significant attenuation for transmitted signals above (e.g., 20 dB at 7 GHz) and below (e.g., 20 dB around 2 GHz) the superconducting qubit frequency range (e.g., 3-5 GHz), while allowing the signals in the qubit signal range to pass moderately attenuated (i.e., attenuated by about 10 dB).

Figure 6:
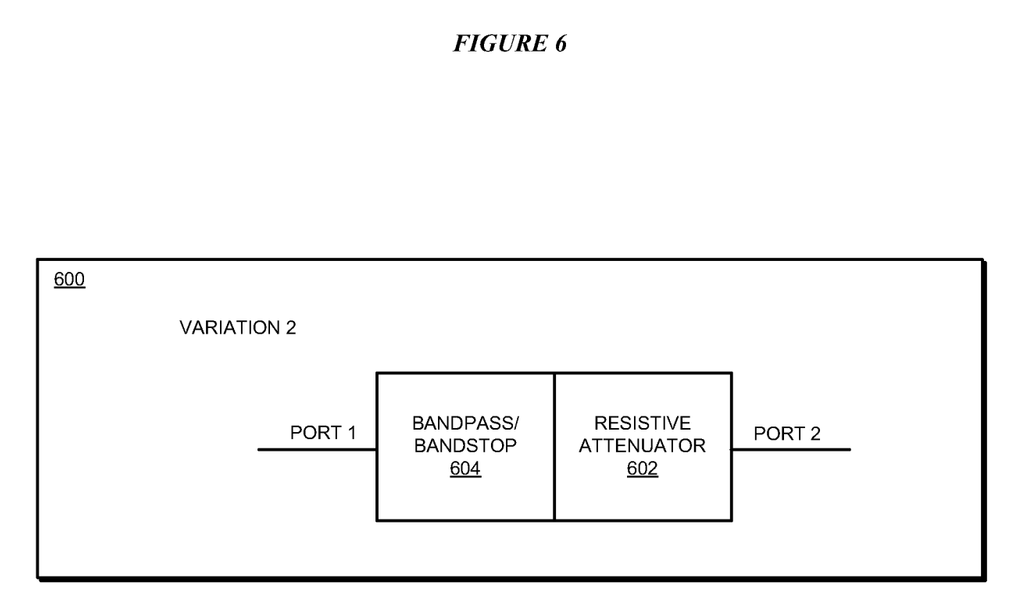
FIG. 6 depicts another example configuration of a hybrid attenuator in accordance with an illustrative embodiment.

With reference to FIG. 6, this figure depicts another example configuration of a hybrid attenuator in accordance with an illustrative embodiment. The example configuration in this figure—variation 2—of hybrid attenuator 600 comprises resistive attenuator 602 and bandpass (or bandstop) filter 604. The components can be arranged in a variety of arrangements within the scope of the illustrative embodiments. For example, one arrangement may be 604-602 in that order as shown (i.e., bandpass filter 604, followed by resistive attenuator 602). Other arrangements may be 602-604, 604-602-604 for different frequency bands, and others possible arrangements in a similar manner.

Hybrid attenuator 600 is a dispersive-resistive attenuator and can be implemented as a two-port integrated circuit. Bandpass filter 604 is a dispersive filter to allow a frequency band that is between two threshold frequencies (and attenuates/blocks frequencies outside this pass band). Resistive attenuator 602 is resistive or absorptive filter that operates in the manner of resistive attenuator 302 in FIG. 3. According to one embodiment, a circuit assembly system forms and connects together the two components—602 and 604 on the same chip or printed circuit board.

Figure 7:
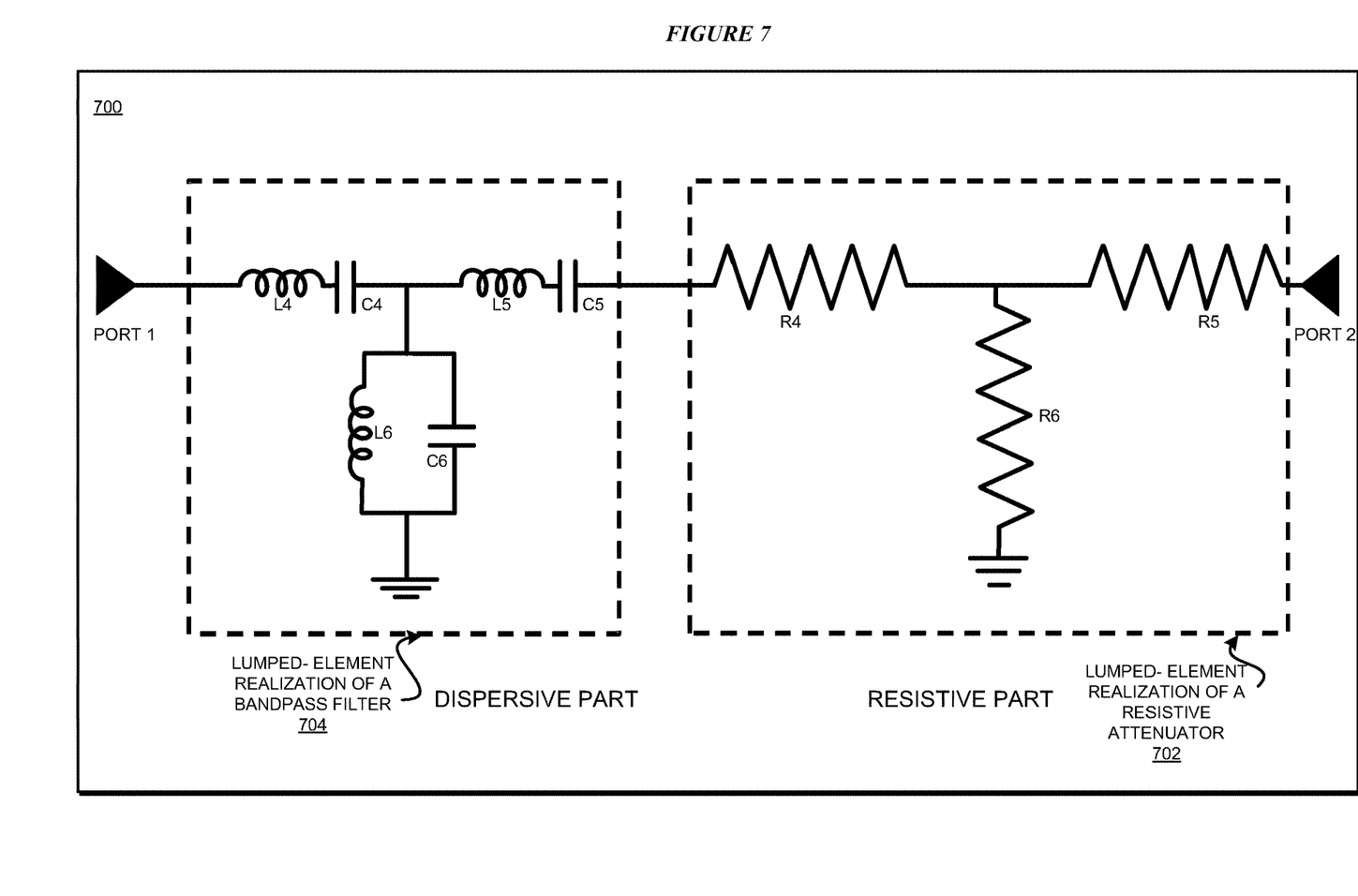
FIG. 7 depicts an example circuit implementing a hybrid attenuator in accordance with an illustrative embodiment.

With reference to FIG. 7, this figure depicts an example circuit implementing a hybrid attenuator in accordance with an illustrative embodiment. Component 702 is a resistive element which implements a resistive attenuator in a manner similar to component 302 of FIG. 3. Component 704 is a dispersive element which implements a bandpass filter which replaces components 304 and 306 of FIG. 3 and plays a similar role.

Component 702 comprises a T-configuration of resistor elements R4, R5, and R6, as in FIG. 2. Note that the depiction of component 702 and resistors R4, R5, and R6 are lumped realizations, i.e., a representation of an effective function of component 702 as a resistive attenuator in the microwave frequency band.

Component 704 comprises a configuration of capacitive elements L6 and C6 in parallel and coupled to ground, i.e., the external conductor of the hybrid attenuator on one side. L6-C6 couple to L4-C4 series and L5-C5 series via an internal conductor of the hybrid attenuator on the other side, as shown. The depiction of component 704 and elements L4-L6 and C4-C6 are lumped realizations, i.e., a representation of an effective function of component 704 as a bandpass filter in the microwave frequency band. This example shows a simple one-unit-cell, bandpass filter. This design also covers the cases in which the simple bandpass filter shown in FIG. 7 is replaced by a more sophisticated bandpass filter that consists of several unit cells and whose attenuation, transmission, bandwidth, cutoff frequency and ripples characteristics are optimized further or differently.

In component 704, capacitive elements C4 and C5 on the internal conductor of the hybrid attenuator serve as DC blocks, which can be used to eliminate the formation of ground loops in the fridge. Such ground loops are undesirable as they can generate electronic noise. Inductive element L6 connecting the center and external conductors of the hybrid attenuator offers a path of negligible resistance between the center conductor and the external conductor of the hybrid attenuator. Such low-resistance, electrical-thermal paths can significantly improve the thermalization of the center conductor of the hybrid attenuator compared to the case of the resistive attenuator alone, where the center conductor is thermally isolated from ground (the attenuator case) by a considerable electrical-thermal resistance.

The lumped realizations of components 702 and 704 406 are not intended to be limiting. From this disclosure, those of ordinary skill in the art will be able to conceive many other implementations for a depicted lumped realization, e.g., using additional or different elements to achieve a similar function of the lumped realization shown here, and such implementations are contemplated within the scope of the illustrative embodiments.

Figure 8:
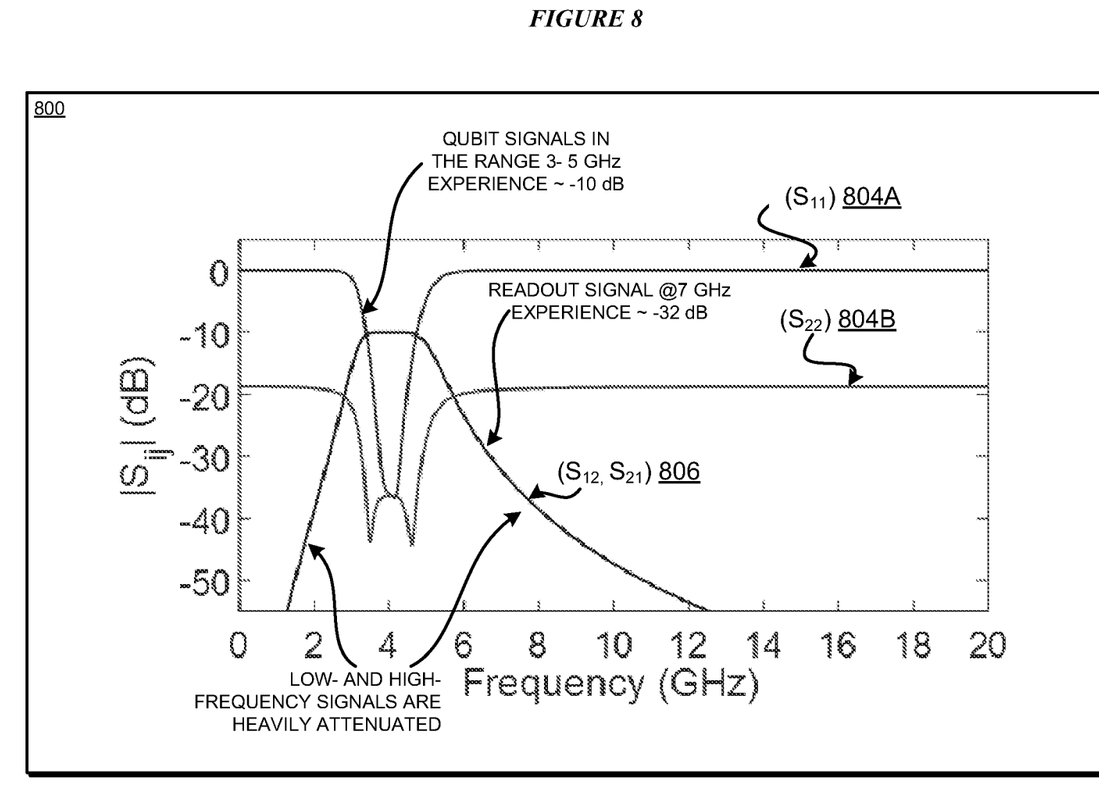
FIG. 8 depicts microwave simulation results of the scattering parameters of a hybrid attenuator example.

With reference to FIG. 8, this figure depicts microwave simulation results of the scattering parameters of a hybrid attenuator example. The hybrid attenuator circuit, whose scattering parameters are shown in FIG. 8, is based on the lumped-element circuit 700 exhibited in FIG. 7. Specifically, in the non-limiting example implementation, R4 and R5 were each set to 27 Ohms, R6 was set to 36 Ohms, L4 and L5 were each set to 3.98 nH, C4 and C5 were each set to 0.398 pF, L6 was set to 0.497 nH, and C6 was set to 3.18 pF.

Graphs 804A and 804B represent the reflection parameter $S_{11}$ and $S_{22}$, respectively, for the example hybrid attenuator configuration shown in FIG. 7. Graph 804A exhibits significant reflection outside the frequency range of qubit signals, which is approximately 3 to 5 GHz. Whereas, graph 804B exhibits good matching to 50 Ohm (i.e., the characteristic impedance of the external ports of the hybrid attenuator) in the qubit frequency range.

Graph 806 represents the transmission parameters $S_{21}$ and $S_{12}$ for the example hybrid attenuator shown in FIG. 7. Graph 806 shows significant attenuation above and below the qubit frequency range. Component 702 with the bandpass filter 704 configuration produced a low level attenuation of approximately −10 to −12 decibels (dB) in the range of qubit signals, which is approximately 3 to 5 GHz in input signals, thus passing the qubit signals with relatively small attenuation while suppressing noise and signals outside the qubit range. Such a moderate attenuation of qubit signals might be useful when the duration of the quantum gates decreases with higher-power qubit-pulses (e.g., cross-resonance gates).

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A hybrid microwave attenuator circuit (circuit) having a first port and a second port, the circuit comprising:
    a resistive component configured to attenuate a plurality of frequencies in an input signal (transmitted signal); and
    a dispersive component configured to attenuate a second plurality of frequencies within a frequency range by reflecting off of the input signal at those frequencies that are within the frequency range, wherein the resistive component and the dispersive component are arranged in a series configuration relative to one another between the first port and the second port of the hybrid attenuator,
    wherein the dispersive component comprises:
        a first inductive element;
        a first capacitive element electrically connected in series with the first inductive element, the first capacitive element and the first inductive element being between the first port and the resistive component;
        a second inductive element providing an electrical-thermal connection between the resistive component and an attenuator housing; and
        a second capacitive element electrically connected in parallel with the second inductive element.

2. The circuit of claim 1, the dispersive component further comprising:
    a bandpass filter.

3. The circuit of claim 2, wherein the bandpass filter provides a greater than a threshold attenuation for frequencies outside a qubit frequency range in the transmitted signal.

4. The circuit of claim 2, wherein the bandpass filter comprises a configuration of inductive and capacitive elements such that some of the capacitive elements are in series with an internal conductor of the hybrid attenuator and operate as a direct current block, and wherein some of the inductive elements are connected between an internal and external conductors of the hybrid attenuator.

5. The circuit of claim 1, wherein the resistive component comprises a set of resistive elements configured in a T-arrangement or a pi-arrangement.

6. The circuit of claim 1, wherein the resistive component provides a greater than a threshold attenuation for all frequencies of the input signal.

7. A circuit assembly system performing operations comprising:
    configuring a resistive component to attenuate a plurality of frequencies in an input signal (transmitted signal); and
    configuring a dispersive component to attenuate a second plurality of frequencies within a frequency range by reflecting off of the input signal at those frequencies that are within the frequency range, wherein the resistive component and the dispersive component are arranged in a series configuration relative to one another between a first port and a second port of a hybrid attenuator,
    wherein the dispersive component comprises:
        a first inductive element;
        a first capacitive element electrically connected in series with the first inductive element, the first capacitive element and the first inductive element being between the first port and the resistive component;
        a second inductive element providing an electrical-thermal connection between the resistive component and an attenuator housing; and
        a second capacitive element electrically connected in parallel with the second inductive element.

8. A method comprising:
    configuring a resistive component to attenuate a plurality of frequencies in an input signal (transmitted signal); and
    configuring a dispersive component to attenuate a second plurality of frequencies within a frequency range by reflecting off of the input signal at those frequencies that are within the frequency range, wherein the resistive component and the dispersive component are arranged in a series configuration relative to one another a first port and a second port of a hybrid attenuator, wherein the dispersive component comprises:

a first inductive element;

a first capacitive element electrically connected in series with the first inductive element, the first capacitive element and the first inductive element being between the first port and the resistive component;

a second inductive element providing an electrical-thermal connection between the resistive component and an attenuator housing; and a second capacitive element electrically connected in parallel with the second inductive element.

9. The method of claim 8, the dispersive component further comprising:

a bandpass filter.

10. The method of claim 9, wherein the bandpass filter provides a greater than a threshold attenuation for frequencies outside a qubit frequency range in the transmitted signal.

11. The method of claim 9, wherein the bandpass filter comprises a configuration of inductive and capacitive elements such that some of the capacitive elements are in series with an internal conductor of the hybrid attenuator and operate as a direct current block, and wherein some of the inductive elements are connected between an internal and external conductors of the hybrid attenuator.

12. The method of claim 8, wherein the resistive component comprises a set of resistive elements configured in a T-arrangement or a pi-arrangement.

* * * * *